United States Patent
Kim (10) Patent No.: US 8,138,793 B1
(45) Date of Patent: Mar. 20, 2012

(54) INTEGRATED CIRCUIT AND METHOD FOR OPERATING THE SAME

(75) Inventor: Kwan-Dong Kim, Gyeonggi-do (KR)

(73) Assignee: Hynix Semiconductor, Gyeonggi-do (KR)

( * ) Notice: Subject to any disclaimer, the term of this patent is extended or adjusted under 35 U.S.C. 154(b) by 0 days.

(21) Appl. No.: 12/981,325

(22) Filed: Dec. 29, 2010

(30) Foreign Application Priority Data

Dec. 9, 2010 (KR) .................... 10-2010-0125501

(51) Int. Cl.
*H03K 19/0175* (2006.01)
*H03K 19/20* (2006.01)

(52) U.S. Cl. ..................... 326/82; 326/115; 326/127

(58) Field of Classification Search ............. 326/82–87, 326/115, 127
See application file for complete search history.

(56) References Cited

U.S. PATENT DOCUMENTS

| | | | |
|---|---|---|---|
| 6,847,225 B2 * | 1/2005 | Viehmann et al. | 326/30 |
| 7,183,805 B2 * | 2/2007 | Wang et al. | 326/86 |
| 7,196,551 B2 * | 3/2007 | Lee | 326/115 |
| 7,541,855 B2 * | 6/2009 | Cranford et al. | 327/280 |
| 2004/0041593 A1 * | 3/2004 | Lai | 326/115 |
| 2005/0264321 A1 * | 12/2005 | Lee | 326/115 |
| 2006/0158223 A1 * | 7/2006 | Wang et al. | 326/86 |
| 2009/0322394 A1 * | 12/2009 | Song et al. | 327/170 |
| 2011/0121860 A1 * | 5/2011 | Song et al. | 326/80 |
| 2011/0181332 A1 * | 7/2011 | Song et al. | 327/233 |

* cited by examiner

*Primary Examiner* — Shawki S Ismail
*Assistant Examiner* — Thienvu Tran
(74) *Attorney, Agent, or Firm* — IP & T Group LLP (57) ABSTRACT

An integrated circuit includes a CML swing reference voltage generating unit, a CML bias control voltage generating unit and a CML buffering unit. The CML swing reference voltage generating unit determines a level of a CML swing reference voltage in response to a frequency setting code and a CML bias control voltage. The CML bias control voltage generating unit compares the level of the CML swing reference voltage with a level of a CML target reference voltage and determines a level of the CML bias control voltage based on the comparison result. The CML buffering unit generates a CML output signal swinging in a CML region by buffering an input signal and determines a swing level of the CML output signal on the basis of the level of the CML swing reference voltage in response to the frequency setting code and the CML bias control voltage.

23 Claims, 5 Drawing Sheets

INTEGRATED CIRCUIT AND METHOD FOR OPERATING THE SAME

CROSS-REFERENCE TO RELATED APPLICATIONS

The present application claims priority of Korean Patent Application No. 10-2010-0125501, filed on Dec. 9, 2010, which is incorporated herein by reference in its entirety.

BACKGROUND OF THE INVENTION

Exemplary embodiments of the present invention relate to semiconductor design technology, and more particularly, to an integrated circuit including a circuit for generating or transmitting a signal that swings in a current mode logic (CML) region and a method for operating the same.

In integrated circuits, a signal swinging in a CML region (hereinafter, referred to as a CML signal) is widely used in an input/output (I/O) interface for a high frequency signal such as a clock signal.

The CML region refers to a potential level region having a range defined by a certain DC potential level, or a potential level region having a range defined by an average potential level determined by a certain criterion. The CML signal refers to a signal toggling at a predefined frequency between a maximum potential level (Vmax) of the CML region and a minimum potential level (Vmin) of the CML region with a reference potential level in the CML region as the center.

For example, although a level of a power supply voltage (VDD) and a level of a ground voltage (VSS) in a device for inputting/outputting a CML signal are respectively 1.5 V and 0 V, the CML region may be defined in a range from 1.5 V to 1.0 V. A reference potential level of the CML region is 1.25 V, and the CML signal is a signal toggling at a predefined frequency and having a swing width of 0.5 V with 1.25 V at the center.

As described above, the CML region is designed to have a relatively small size compared with a potential level region defined by a level of a power supply voltage (VDD) and a level of a ground voltage (VSS) in a device for inputting/outputting a CML signal. This is because the CML signal is generally a high frequency clock signal.

That is, the CML region is a region defined for transferring a clock signal stably even though the clock signal is a high frequency clock signal ranging from several GHz to several tens of GHz or more.

For reference, because it is general that the CML signal toggles with a small swing range at a high frequency as described above, a potential level of the CML signal may change or the phase of the CML signal may be distorted due to a transmission noise thereof. What is therefore used is a differential scheme that simultaneously transmits two divided signals with opposite phases when transmitting the CML signal.

In integrated circuits, a signal swinging in a CMOS region (hereinafter, referred to as a CMOS signal) is widely used in an I/O interface for a signal which is used to determine its logic level like data.

The CMOS region refers to a potential level region defined by a level of a power supply voltage (VDD) and a level of a ground voltage (VSS). The CMOS signal refers to a signal toggling at a predefined frequency between a level of a power supply voltage (VDD), which is a maximum potential level (Vmax) of the CMOS region, and a level of a ground voltage (VSS), which is a minimum potential level (Vmin) of the CMOS region, with a half potential level between the level of the power supply voltage (VDD) and the level of the ground voltage (VSS) as the center.

Therefore, as described above, in the case of the CML region, even though the level of the power supply voltage (VDD) and the level of the ground voltage (VSS) are respectively 1.5 V and 0 V, the potential levels of 1.5 V and 1.0 V are specified as the CML region, so that the swing width of the CML signal may be 0.5 V. However, in the case of the CMOS region, when the level of the power supply voltage (VDD) and the level of the ground voltage (VSS) are respectively 1.5 V and 0 V, the potential levels of 1.5 V and 0 V are determined as the CMOS region. Thus, the swing width of the CMOS signal is 1.5 V.

For this reason, the swing range of the CMOS signal is inevitably lager than the swing range of the CML signal. This means that the CMOS signal is suitable to be used as data whose logic level is determined depending on the potential level.

Figure 1:
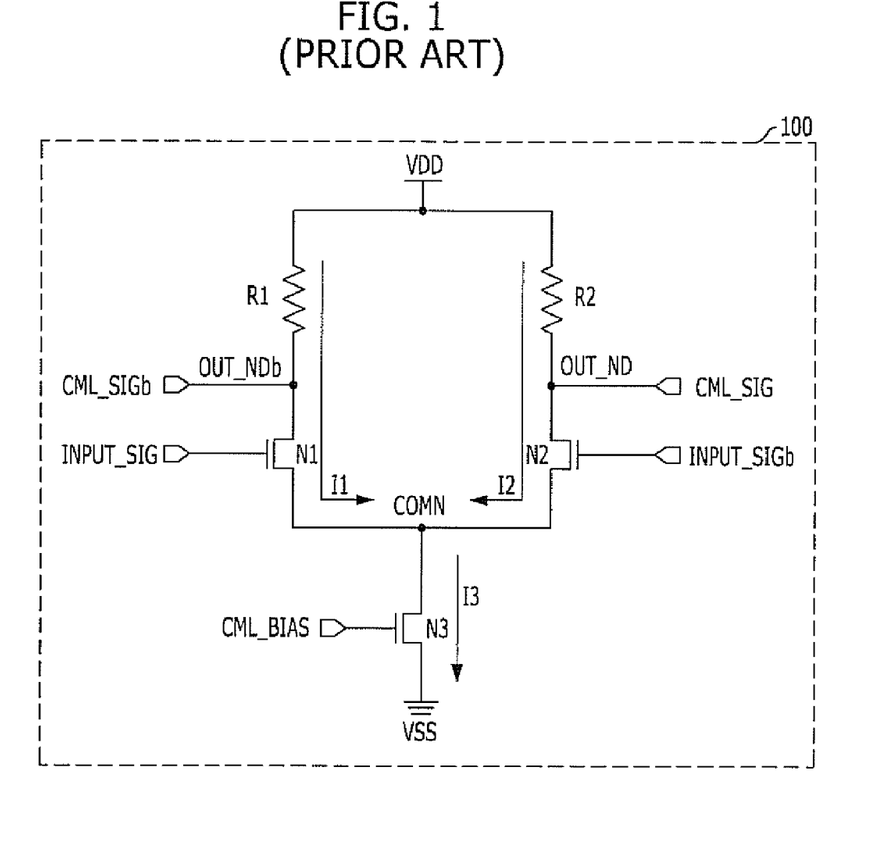
FIG. 1 is a circuit diagram illustrating a circuit for generating or transferring a CML signal in a conventional integrated circuit.

FIG. 1 is a circuit diagram illustrating a circuit for generating or transferring a CML signal in a conventional integrated circuit.

An operation of the circuit is described below with reference to FIG. 1.

Referring to FIG. 1, a positive input signal INPUT_SIG and a negative input signal INPUT_SIGb have opposite phases. Also, a CML bias voltage CML_BIAS maintains a potential level corresponding to a logic high level. Thus, a third NMOS transistor N3 is turned on to transfer a constant current from a common node COMN to a ground voltage (VSS) terminal.

In this state, when a potential level of the positive input signal INPUT_SIG increases and a first NMOS transistor N1 is turned on, a voltage level of the negative input signal INPUT_SIGb decreases and a second NMOS transistor N2 is turned off. Accordingly, a predetermined current I1 continuously flows from a negative output node OUT_NDb to the common node COMN, but a current I2 does not flow from a positive output node OUT_ND to the common node COMN.

Therefore, a potential level of a negative CML signal CML_SIGb outputted through the negative output node OUT_NDb decreases, and a potential level of a positive CML signal CML_SIG outputted through the positive output node OUT_ND increases.

On the other hand, when a potential level of the positive input signal INPUT_SIG decreases and the first NMOS transistor N1 is turned off, a voltage level of the negative input signal INPUT_SIGb increases and the second NMOS transistor N2 is turned on. Accordingly, a current I1 does not flow from the negative output node OUT_NDb to the common node COMN, but a predetermined current I2 continuously flows from the positive output node OUT_ND to the common node COMN.

Therefore, a potential level of the negative CML signal CML_SIGb outputted through the negative output node OUT_NDb increases, and a potential level of the positive CML signal CML_SIG outputted through the positive output node OUT_ND decreases.

The decrease degree of the potential level of the CML signal (CML_SIG, CML_SIGb) may vary depending on the resistance of a first resistor R1 and the resistance of a second resistor R2. This is because the potential level of the CML signal (CML_SIG, CML_SIGb) decreases depending on how much the potential amount changes while the current I1 or I2 passes through the first resistor R1/the first NMOS transistor N1/the third NMOS transistor or the second resistor R2/the second NMOS transistor N2/the third NMOS transistor N3.

Thus, the potential level of the CML signal (CML_SIG, CML_SIGb) is determined depending on a voltage division formed by the current I1 between the first resistor R1, the first NMOS transistor N1, and the third NMOS transistor N3, or a voltage division formed by the current I2 between the second resistor R2, the second NMOS transistor N2, and the third NMOS transistor N3.

The first resistor R1 and the second resistor R2 have the same resistance. Therefore, as the resistance of the first resistor R1 and the second resistor R2 increases, the potential level of the CML signal (CML_SIG, CML_SIGb) approaches the level of the ground voltage VSS. As the resistance of the first resistor R1 and the second resistor R2 decreases, the potential level of the CML signal (CML_SIG, CML_SIGb) shifts far away from the level of the ground voltage VSS.

On the other, the increase degree of the potential level of the CML signal (CML_SIG, CML_SIGb) is determined in the state where a current does not continuously flow through the first resistor R1 and the second resistor R2. Therefore, the potential level of the CML signal (CML_SIG, CML_SIGb) increases up to the same level as the power supply voltage VDD.

Figure 2:
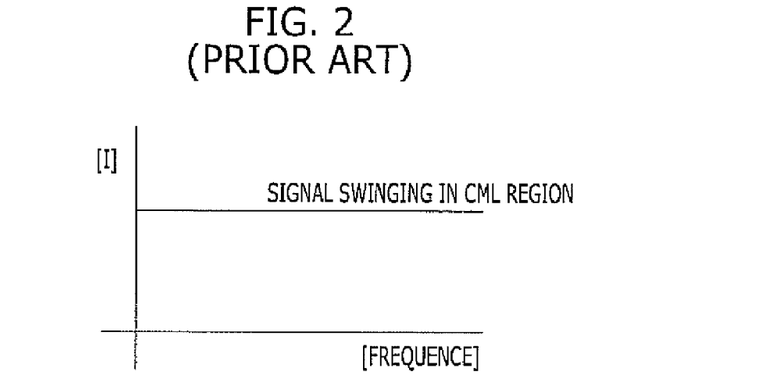
FIG. 2 is a graph illustrating a change in the current amount depending on a change in the operation frequency, which is consumed by the circuit of FIG. 1 for generating or transferring a CML signal in a conventional integrated circuit.

FIG. 2 is a graph illustrating a change in the current amount depending on a change in the operation frequency, which is consumed by the circuit of FIG. 1 for generating or transferring a CML signal in a conventional integrated circuit.

Referring to FIG. 2, it can be seen that a circuit 100 for generating or transferring the CML signal (CML_SIG, CML_ SIGb) in a conventional integrated circuit consumes a constant current regardless of a change in the operation frequency.

The input signals INPUT_SIG and INPUT_SIGb are classified into a positive input signal INPUT_SIG and a negative input signal INPUT_SIGb that have opposite phases. Therefore, the first NMOS transistor N1 and the second NMOS transistor N2, which operate in response to the input signals INPUT_SIG and INPUT_SIGb, are controlled such that when one of the first NMOS transistor N1 and the second NMOS transistor N2 is turned on, the other is turned off. That is, the first NMOS transistor N1 and the second NMOS transistor N2 are controlled such that they perform opposite operations.

The first NMOS transistor N1 and the second NMOS transistor N2 have the same size. Therefore, the total amount of the currents I1 and I2 flowing from the power supply voltage (VDD) terminal to the common node COMN does not change regardless of whether the potential levels of the input signals INPUT_SIG and INPUT_SIGb change, and regardless of whether the potential levels of the CML signals CML_SIG and CML_SIGb change.

The CML bias voltage CML_BIAS is a signal that always maintains a constant potential level. Therefore, while power is supplied to the integrated circuit, the third NMOS transistor N3 is always turned on to transfer a constant current I3 from the common node COMN to the ground voltage (VSS) terminal.

Thus, the circuit 100 for generating or transferring the CML signal (CML_SIG, CML_SIGb) consumes a constant current regardless of whether it is in a high frequency state where the potential levels of the input signals INPUT_SIG and INPUT_SIGb change at a high speed or in a low frequency state where the potential levels of the input signals INPUT_SIG and INPUT_SIGb change at a low speed.

However, that the circuit 100 consumes a constant current regardless of whether it is in a high frequency state or in a low frequency state may be advantageous when the circuit 100 is to operate at a high frequency, but may be disadvantageous when the circuit 100 is to operate at a low frequency.

That is, the circuit 100 consumes a relatively large current even when it can reduce a consumed current by operating at a low frequency. Therefore, the circuit 100 may consume an unnecessarily large current when it operates at a low frequency.

Figure 3:
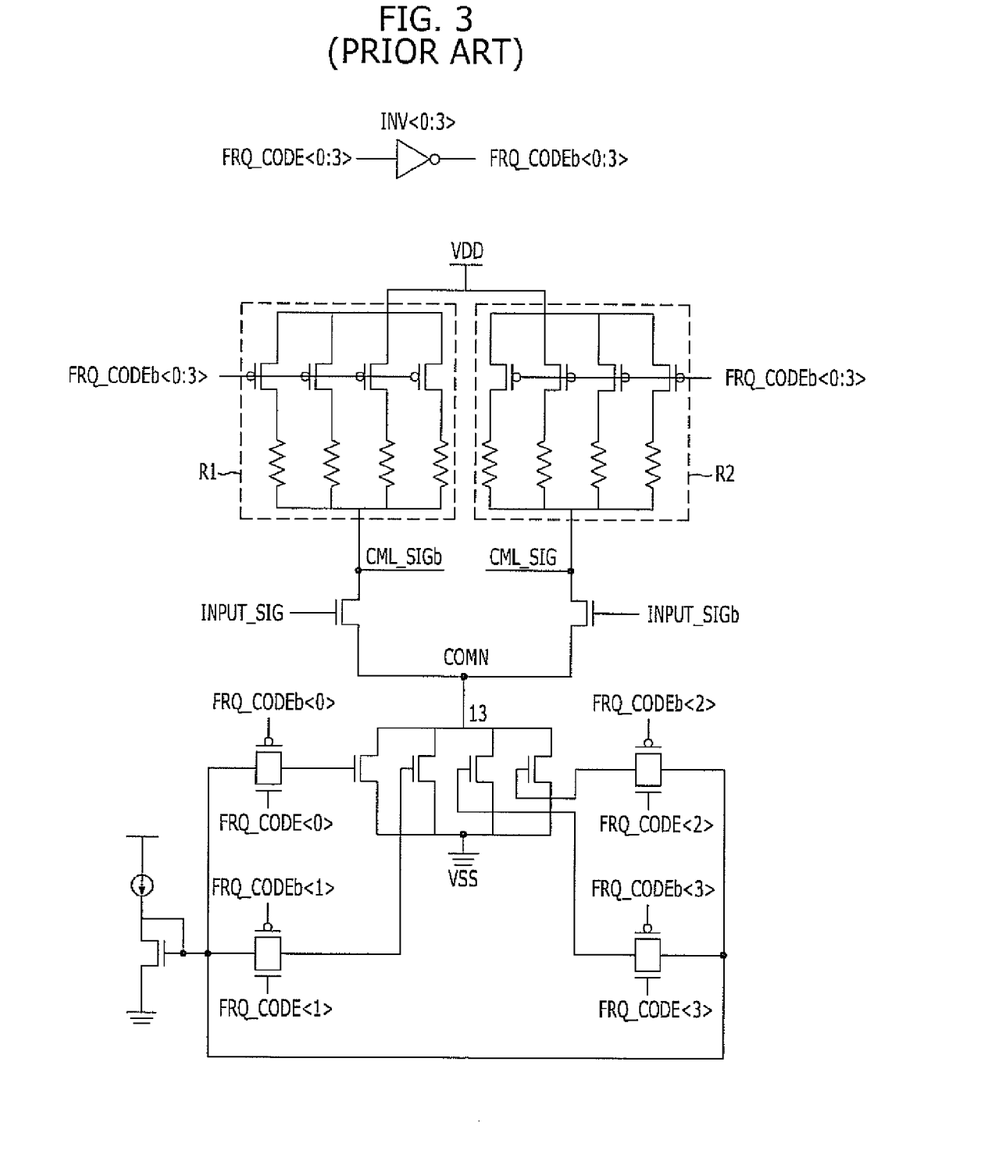
FIG. 3 is a circuit diagram illustrating a modified circuit for generating or transferring a CML signal in a conventional integrated circuit, which can change the current consumption amount depending on a change in the operation frequency.

Therefore, the conventional circuit 100 of FIG. 1 may be modified as illustrated in FIG. 3.

Referring to FIG. 3, in comparison with the configuration of FIG. 1, a configuration is added that controls the resistance of the first resistor R1 and the resistance of the second resistor R2, which is used to determine the state of the decreasing potential levels of the CML signals CML_SIG and CML_ SIGb, depending on a frequency setting code FRQ_ CODE<0:3>.

Also, a configuration is added that controls the amount of the current I3, which flows from the common node COMN to the ground voltage (VSS) terminal in response to the CML bias voltage CML_BIAS, depending on the frequency setting code FRQ_CODE<0:3>.

By this configuration change, when the circuit 100 is to operate at a low frequency, the current consumption amount may be minimized by changing the value of the frequency setting code FRQ_CODE<0:3>.

However, in the circuit of detecting the optimal current amount depending on the operation frequency by changing the value of the frequency setting code FRQ_CODE<0:3> as illustrated in FIG. 3, because an operation of changing the resistance of the first resistor R1 and the resistance of the second resistor R2 and an operation of changing the amount of the current I3 flowing from the common node COMN to the ground voltage (VSS) terminal are simultaneously performed when the value of the frequency setting code FRQ_ CODE<0:3> changes depending on a change in the operation frequency, the swing levels of the CML signals CML_SIG and CML_SIGb may fail to have a desired stable level.

At the circuit design stage, an operation of changing the resistance of the first resistor R1 and the resistance of the second resistor R2 depending on a change in the frequency setting code FRQ_CODE<0:3> and an operation of changing the amount of the current I3 flowing from the common node COMN to the ground voltage (VSS) terminal can be set to be performed complementarily. That is, a change in the swing levels of the CML signals CML_SIG and CML_SIGb due to an operation of changing the resistance of the first resistor R1 and the resistance of the second resistor R2 is compensated by an operation of changing the amount of the current I3 flowing from the common node COMN to the ground voltage (VSS) terminal, so that the swing levels of the CML signals CML_ SIG and CML_SIGb can always have a desired level.

However, in the process of using the fabricated integrated circuit, due to a change in PVT (Process, Voltage, Temperature), an operation of changing the resistance of the first resistor R1 and the resistance of the second resistor R2 depending on a change in the frequency setting code FRQ_ CODE<0:3> and an operation of changing the amount of the current I3 flowing from the common node COMN to the ground voltage (VSS) terminal may be performed without the compensation.

Thus, the swing levels of the CML signals CML_SIG and CML_SIGb may have different levels from the target swing levels.

Therefore, a duty distortion of a signal may occur in the internal circuits of the integrated circuit using such CML signals CML_SIG and CML_SIGb.

SUMMARY OF THE INVENTION

An embodiment of the present invention is directed to a circuit for generating or transferring a CML signal, which is capable of maintaining a target swing level in spite of a change in the operation frequency, in an integrated circuit.

In accordance with an exemplary embodiment of the present invention, an integrated circuit includes: a current mode logic (CML) swing reference voltage generating unit configured to determine a level of a CML swing reference voltage in response to a frequency setting code and a CML bias control voltage; a CML bias control voltage generating unit configured to compare the level of the CML swing reference voltage with a level of a CML target reference voltage and determine a level of the CML bias control voltage based on the comparison result; and a CML buffering unit configured to generate a CML output signal swinging in a CML region by buffering an input signal and determine a swing level of the CML output signal on the basis of the level of the CML swing reference voltage in response to the frequency setting code and the CML bias control voltage.

In accordance with another exemplary embodiment of the present invention, a method of operating an integrated circuit includes: a code changing operation of changing a frequency setting code; a voltage level changing operation of changing a level of a current mode logic (CML) swing reference voltage in response to the changed frequency setting code; a voltage level comparing operation of comparing the changed level of the CML swing reference voltage with a level of a CML target reference voltage and changing a level of a CML bias control voltage based on the comparison result; compensating the changed level of the CML swing reference voltage in response to the changed level of the CML bias control voltage; and buffering an input signal to generate a CML output signal swinging in a CML region.

DESCRIPTION OF SPECIFIC EMBODIMENTS

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 4:
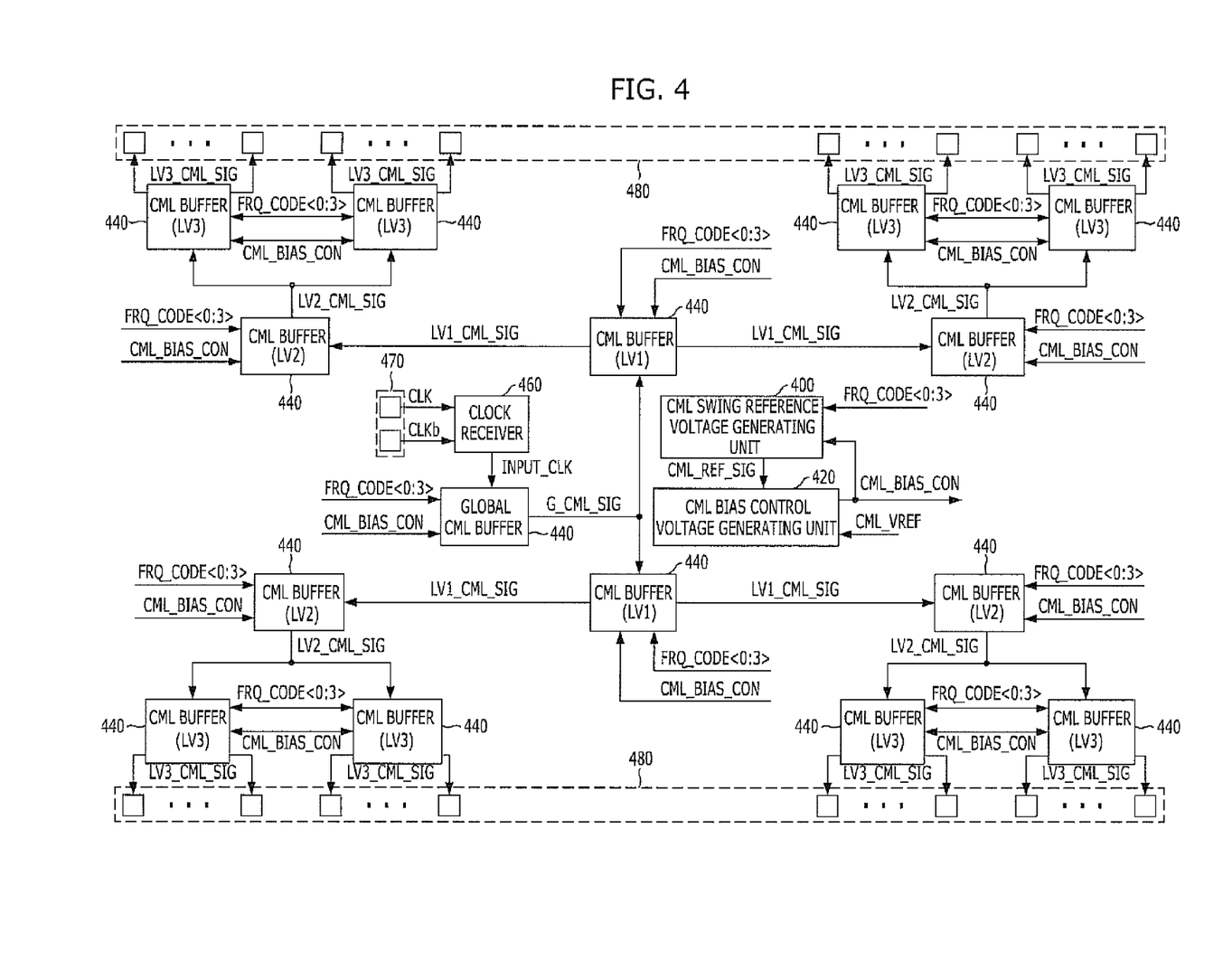
FIG. 4 is a block diagram illustrating a layout configuration of a circuit for generating or transferring a CML signal in an integrated circuit in accordance with an exemplary embodiment of the present invention.

FIG. 4 is a block diagram illustrating a layout configuration of a circuit for generating or transferring a CML signal in an integrated circuit in accordance with an exemplary embodiment of the present invention.

Referring to FIG. 4, a circuit for generating or transferring a CML signal in an integrated circuit in accordance with an exemplary embodiment of the present invention includes a CML swing reference voltage generating unit 400, a CML bias control voltage generating unit 420 and a CML buffering unit 440.

The CML swing reference voltage generating unit 400 determines a level of a CML swing reference voltage CML_REF_SIG in response to a frequency setting code FRQ_CODE<0:3> and a CML bias control voltage CML_BIAS_CON. The CML bias control voltage generating unit 420 compares the level of the CML swing reference voltage CML_REF_SIG with a level of a CML target reference voltage CML_VREF and determines a level of the CML bias control voltage CML_BIAS_CON depending on the comparison result.

The CML buffering unit 440 includes a global CML buffer and a plurality of CML buffers configured to buffer input signals INPUT_CLK, G_CML_SIG, LV1_CML_SIG, and LV2_CML_SIG, generate CML output signals G_CML_SIG, LV1_CML_SIG, LV2_CML_SIG, and LV3_CML_SIG swinging in a CML region, and determine a swing level of the CML output signals on the basis of the level of the CML swing reference voltage CML_REF_SIG in response to the frequency setting code FRQ_CODE<0:3> and the CML bias control voltage CML_BIAS_CON.

Even if the CML buffering unit 440 includes a plurality of CML buffers as shown in FIG. 4, the present invention is not limited thereto, and the CML buffering unit 440 may includes a CML buffer. That is, the CML swing reference voltage generating unit 400 and the CML bias control voltage generating unit 420 may be provided to control one CML buffer. In this manner, the CML buffering unit 440 may correspond to one or more CML buffers. For convenience in description, it is assumed that the CML buffering unit 440 corresponds to one CML buffer.

The CML buffering unit 440 may freely change an operation frequency in response to the frequency setting code FRQ_CODE<0:3>. Even when the CML buffering unit 440 freely changes the operation frequency, the CML output signals G_CML_SIG, LV1_CML_SIG, LV2_CML_SIG, and LV3_CML_SIG outputted from the CML buffering unit 440 swing only in a CML swing region defined by the level of the CML swing reference voltage CML_REF_SIG. This is because the CML swing reference voltage generating unit 400 controls the level of the CML bias control voltage CML_BIAS_CON generated by the CM bias control voltage generating unit 420 to be changed depending on an change in the value of the frequency setting code FRQ_CODE<0:3>, and because the CML buffering unit 440 controls the amount of a sinking current depending an change in the level of the CML bias control voltage CML_BIAS_CON.

The circuit shown in FIG. 4 further includes a clock receiver 460 and a data input/output circuit 480. The clock receiver 460 receives clocks CLK and CLKb from an external device through a clock input pad 470. The data input/output circuit 480 inputs/outputs data in synchronization with the CML output signal LV3_CML_SIG.

Figure 5:
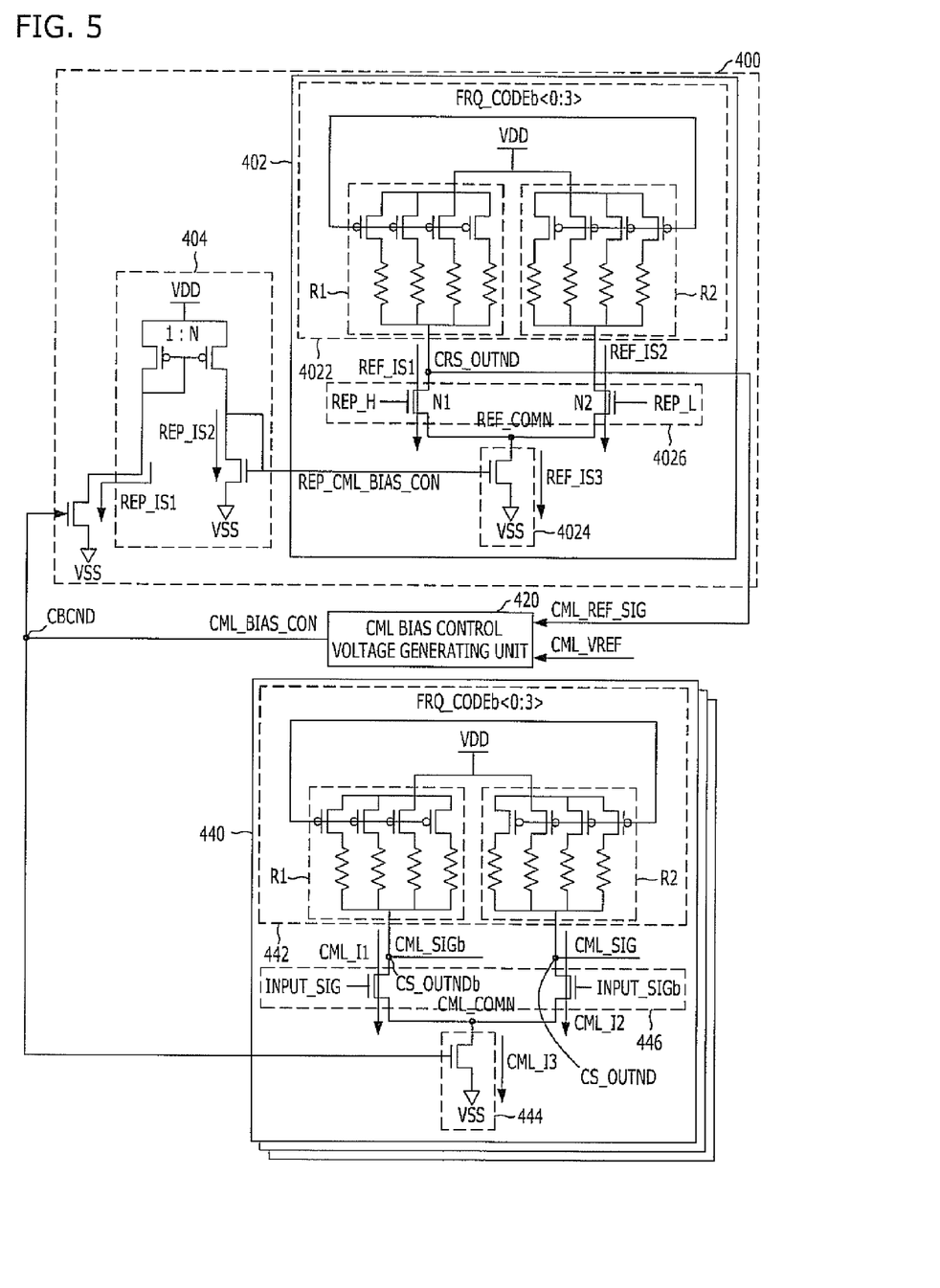
FIG. 5 is a circuit diagram illustrating a detailed configuration of a circuit for generating or transferring a CML signal in an integrated circuit in accordance with an exemplary embodiment of the present invention.

FIG. 5 is a circuit diagram illustrating a detailed configuration of a circuit for generating or transferring a CML signal in an integrated circuit in accordance with an exemplary embodiment of the present invention.

Referring to FIG. 5, a circuit for generating or transferring a CML signal in an integrated circuit in accordance with an exemplary embodiment of the present invention includes a CML swing reference voltage generating unit 400, a CML bias control voltage generating unit 420, and a CML buffering unit 440.

The CML swing reference voltage generating unit 400 determines a level of a CML swing reference voltage CML_REF_SIG in response to a frequency setting code FRQ_CODE<0:3> and a CML bias control voltage CML_BIAS_CON. The CML bias control voltage generating unit 420 compares the level of the CML swing reference voltage CML_REF_SIG with a level of a CML target reference voltage CML_VREF and determines a level of the CML bias control voltage CML_BIAS_CON depending on the comparison result. The CML buffering unit 440 buffers input signals INPUT_SIG and INPUT_SIGb, generates CML output signals CML_SIG and CML_SIGb swinging in a CML region, and determines a swing level of the CML output signals on the basis of the level of the CML swing reference voltage CML_REF_SIG in response to the frequency setting code FRQ_CODE<0:3> and the CML bias control voltage CML_BIAS_CON.

Herein, the CML swing reference voltage generating unit 400 may have various configurations including those illustrated in the drawings.

The CML swing reference voltage generating unit 400 shown in FIG. 5 includes a CML swing reference voltage output unit 402 and a CML bias replica unit 404.

The CML swing reference voltage output unit 402 drives a CMOS region power supply voltage REF_H/REF_L, outputs the CML swing reference voltage CML_REF_SIG, and changes the level of the CML swing reference voltage CML_REF_SIG in response to the frequency setting code FRQ_CODE<0:3> and a replica CML bias control voltage REP_CML_BIAS_CON.

The CML swing reference voltage output unit 402 includes a CML swing reference sourcing current providing unit 4022, a CML swing reference sinking current providing unit 4024, and a power supply voltage input unit 4026.

The CML swing reference sourcing current providing unit 4022 controls the amount of a sourcing current REF_IS1/REF_IS2 of a CML swing reference voltage output terminal CRS_OUTND in response to the frequency setting code FRQ_CODE<0:3>. The CML swing reference sinking current providing unit 4024 controls the amount of a sinking current REF_IS3 of the CML swing reference voltage output terminal CRS_OUTND in response to the replica CML bias control voltage REP_CML_BIAS_CON. The power supply voltage input unit 4026 couples the CML swing reference sourcing current providing unit 4022 with the CML swing reference sinking current providing unit 4024 in an input period of the CMOS region power supply voltage REF_H/REF_L.

The power supply voltage input unit 4026 may have a configuration corresponding to the CMOS region power supply voltages REF_H and REF_L that are inputted as differential signals as illustrated in the drawings, and may have a configuration corresponding to the CMOS region power supply voltages REF_H that is inputted as a single signal (not illustrated in the drawings).

The power supply voltage input unit 4026, which corresponds to the CMOS region power supply voltages REF_H, REF_L that are inputted as differential signals, may includes a first input NMOS transistor N1 and a second input NMOS transistor N2.

The first input NMOS transistor N1 controls the coupling of the drain-coupled CML swing reference sourcing current providing unit 4022 with the source-coupled CML swing reference sinking current providing unit 4024 in response to the first power supply voltage FEF_H among the CMOS region power supply voltages REF_H and REF_L applied to a gate thereof. The second input NMOS transistor N2 controls the coupling of the drain-coupled CML swing reference sourcing current providing unit 4022 with the source-coupled CML swing reference sinking current providing unit 4024 in response to the second power supply voltage FEF_L among the CMOS region power supply voltages REF_H and REF_L applied to a gate thereof.

The power supply voltage input unit 4026, which corresponds to the CMOS region power supply voltage REF_H that is inputted as a single signal, may include a input NMOS transistor N1 configured to control the coupling of the drain-coupled CML swing reference sourcing current providing unit 4022 with the source-coupled CML swing reference sinking current providing unit 4024 in response to the first power supply voltage FEF_H among the CMOS region power supply voltages REF_H and REF_L applied to a gate thereof. Here, if the power supply voltage input unit 4026 has a configuration corresponding to the CMOS region power supply voltages REF_H that is inputted as a single signal, a configuration corresponding to 'R2' among the configurations of the CML swing reference sourcing current providing unit 4022 is omitted.

In the above configuration, the first power supply voltage REF_H among the CMOS region power supply voltages REF_H and REF_L means the CMOS region power supply voltage having a logic high level, and the second power supply voltage REF_L means the CMOS region power supply voltage having a logic low level.

Thus, in the configuration of the power supply voltage input unit 4026 corresponding to the CMOS region power supply voltages REF_H and REF_L that are inputted as differential signals, the first NMOS transistor N1 is always turned on and the second NMOS transistor is always turned off. In the configuration of the power supply voltage input unit 4026 corresponding to the CMOS region power supply voltage REF_H that is inputted as a single signal, the NMOS transistor N1 is always turned on.

That is, the configuration of the power supply voltage input unit 4026 corresponding to the CMOS region power supply voltage REF_H that is inputted as a single signal is more efficient than the configuration of the power supply voltage input unit 4026 corresponding to the CMOS region power supply voltages REF_H and REF_L that are inputted as differential signal.

However, the configuration of the power supply voltage input unit 4026 corresponding to the CMOS region power supply voltages REF_H and REF_L that are inputted as differential signal is more widely used than the configuration of the power supply voltage input unit 4026 corresponding to the CMOS region power supply voltage REF_H that is inputted as a single signal. This is because the configuration of the power supply voltage input unit 4026 corresponding to the CMOS region power supply voltages REF_H and REF_L that are inputted as differential signals provides a more stable operation than the configuration of the power supply voltage input unit 4026 corresponding to the CMOS region power supply voltage REF_H that is inputted as a single signal.

The CML bias replica unit 404 is coupled in a current mirror configuration to an input node CBCND of the CML bias control voltage CML_BIAS_CON to generate the replica CML bias control voltage REF_CML_BIAS_CON whose voltage level has a predetermined ratio (1:N) with the voltage level of the CML bias control voltage CML_BIAS_CON.

More specifically, the ratio of the CML bias control voltage CML_BIAS_CON to the replica CML bias control voltage REF_CML_BIAS_CON is set to the predetermined ratio (1:N), so that the CML swing reference voltage output unit 402 operates more rapidly than the CML buffering unit 440 in response to a change in the voltage level of the CML bias control voltage CML_BIAS_CON.

That is, the CML swing reference voltage generating unit 400, which receives the replica CML bias control voltage REP_CML_BIAS_CON, whose swing range is amplified by N times from that of the CML bias control voltage CML_BIAS_CON by the CML bias replica unit 404, operates more rapidly than the CML buffering unit 400 that directly receives the CML bias control voltage CML_BIAS_CON. Thus, the CML buffering unit 440 can perform a more stable operation in response to a change in the frequency setting code FRQ_CODE<0:3>.

Also, the presence of the CML bias replica unit 404 prevents the level of the CML bias control voltage CML_BIAS_CON from changing because the operations of the CML bias control voltage generating unit 420 and the CML swing reference voltage generating unit 400 and the operation of the CML buffering unit 440 are affected by each other.

However, the CML bias replica unit 404 is merely optional, and the CML swing reference voltage generating unit 400 may include only the CML swing reference voltage output unit 402.

The CML swing reference voltage generating unit 400 may include a CML swing reference sourcing current providing unit 4022, a CML swing reference sinking current providing unit 4024, and a power supply voltage input unit 4026.

The CML swing reference sourcing current providing unit 4022 controls the amount of a sourcing current of a CML swing reference voltage output terminal CRS_OUTND in response to the frequency setting code FRQ_CODE<0:3>. The CML swing reference sinking current providing unit 4024 controls the amount of a sinking current of the CML swing reference voltage output terminal CRS_OUTND in response to the CML bias control voltage CML_BIAS_CON. The power supply voltage input unit 4026 couples the CML swing reference sourcing current providing unit 4022 with the CML swing reference sinking current providing unit 4024 in an input period of the CMOS region power supply voltage REF_H/REF_L.

The CML buffering unit 440 includes a CML output sourcing current providing unit 442, a CML output sinking current providing unit 444 and a signal input unit 446.

The CML output sourcing current providing unit 442 controls the amount of a source current CML_I1/CML_I2 of a CML region signal output terminal CS_OUTNDb/CS_OUTND in response to the frequency setting code FRQ_CODE<0:3>. The CML output sinking current providing unit 444 controls the amount of a sinking current CML_I3 of the CML region signal output terminal CS_OUTND/CS_OUTNDb in response to the CML bias control voltage CML_BIAS_CON. The signal input unit 446 controls the coupling of the CML output sourcing current providing unit 442 with the CML output sinking current providing unit 444 in response to an input signal INPUT_SIG/INPUT_SIGb to change a potential level of a CML output signal CML_SIG/CML_SIGb.

It can be seen that the CML buffering unit 440 has about the same configuration of the CML swing reference voltage output unit 402. The difference is that the CML swing reference voltage output unit 402 receives the CMOS region power supply voltage REF_H/REF_L to output the CML swing reference voltage CML_REF_SIG, whereas the CML buffering unit 440 receives the input signal INPUT_SIG/INPUT_SIGb to output the CML output signal CML_SIG/CML_SIGb.

That the CML buffering unit 440 and the CML swing reference voltage output unit 402 have about the same configuration means that the CML buffering unit 440 and the CML swing reference voltage output unit 402 perform the same operation (i.e., changing the amount of the sourcing current REF_IS1 and REF_IS2/CML_I1 and CML_I2) depending on a change in the value of the frequency setting code FRQ_CODE<0:3> in the process of changing the operation frequency, and the CML buffering unit 440 and the CML swing reference voltage output unit 402 perform the same operation (i.e., changing the amount of the sinking current REF_IS3/CML_I3) depending on an change in the CML bias control voltage CML_BIAS_CON. This means that the feedback operation of equalizing the level of the CML swing reference voltage CML_REF_SIG outputted from the CML swing reference voltage output unit 402 to the level of the CML target reference voltage CML_VREF may also be applicable to the operation of the CML buffering unit 440.

Figure 6:
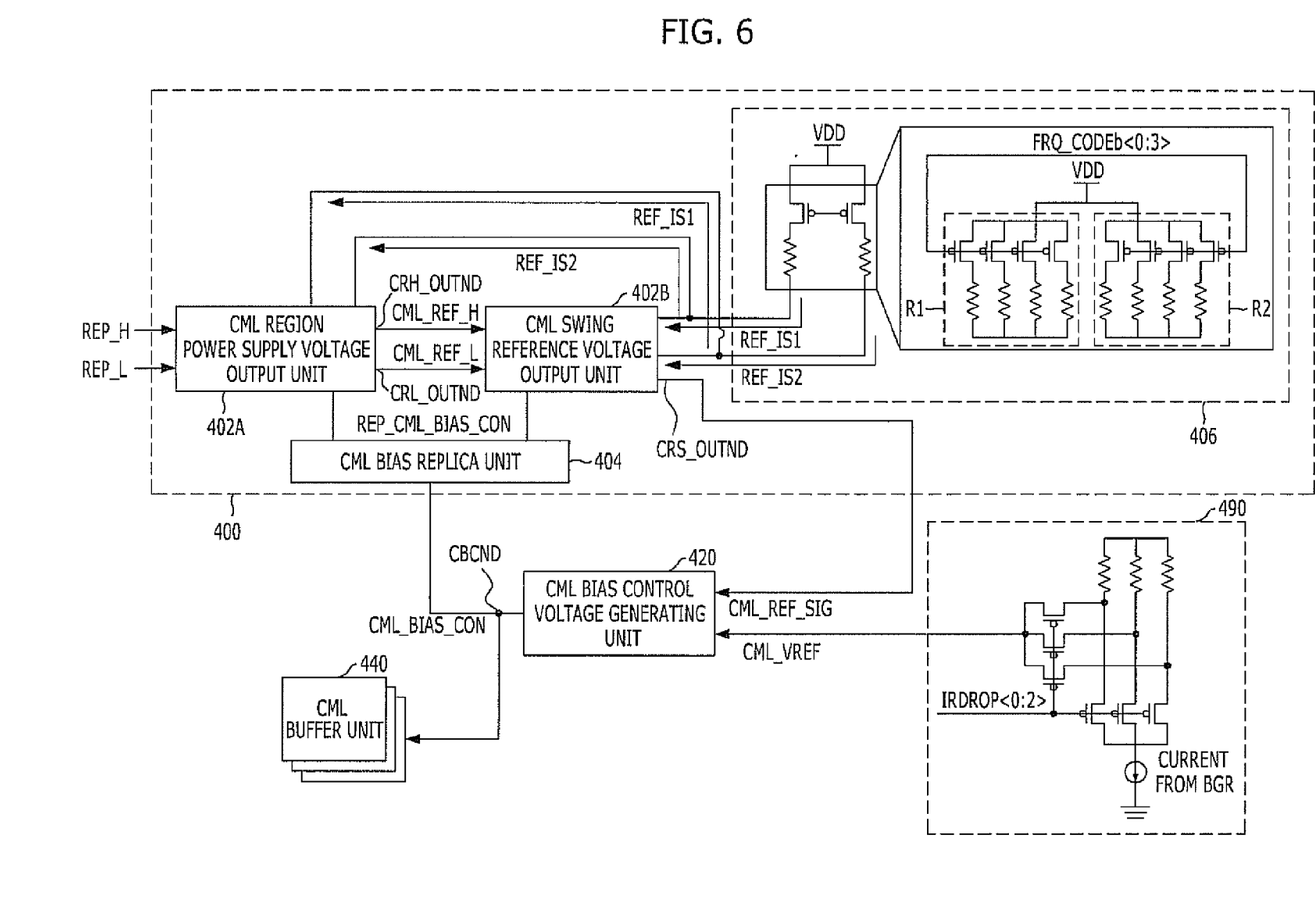
FIG. 6 is a block diagram illustrating a detailed configuration of a circuit for generating or transferring a CML signal in an integrated circuit in accordance with another exemplary embodiment of the present invention.

FIG. 6 is a block diagram illustrating a detailed configuration of a circuit of FIG. 5 for generating or transferring a CML signal in an integrated circuit in accordance with another exemplary embodiment of the present invention.

Referring to FIG. 6, a circuit for generating or transferring a CML signal includes a CML swing reference voltage generating unit 400, a CML bias control voltage generating unit 420, and a CML buffering unit 440. The CML swing reference voltage generating unit 400 shown in FIG. 6 includes a CML bias replica unit 404, a CML region power supply voltage output unit 402A and a CML swing reference voltage output unit 402B.

The CML bias replica unit 404 is coupled in a current mirror configuration to an input node CBCND of the CML bias control voltage CML_BIAS_CON to generate a replica CML bias control voltage REP_CML_BIAS_CON. The CML region power supply voltage output unit 402A drives a CMOS region power supply voltage REF_H/REF_L, outputs a CML region power supply voltage CML_REP_H/CML_REP_L, and changes the level of the CML region power supply voltage CML_REP_H/CML_REP_L in response to the frequency setting code FRQ_CODE<0:3> and the replica CML bias control voltage REP_CML_BIAS_CON. The CML swing reference voltage output unit 402B drives the CML region power supply voltage CML_REP_H/CML_REP_L, outputs the CML swing reference voltage CML_REF_SIG, and changes the level of the CML swing reference voltage CML_REF_SIG in response to the frequency setting code FRQ_CODE<0:3> and the replica CML bias control voltage REP_CML_BIAS_CON.

The CML swing reference voltage generating unit 400 of FIG. 5 and the CML swing reference voltage generating unit 400 of FIG. 6 have the following configuration difference. For the process of driving the CMOS region power supply voltage REF_H/REF_L and generating the CML swing reference voltage CML_REF_SIG, only the CML swing reference voltage output unit 402 is included in the configuration of FIG. 5, whereas the CML region power supply voltage output unit 402A and the CML swing reference voltage output unit 402B are included in the configuration of FIG. 6.

That is, the configuration of FIG. 5 directly drives the CMOS region power supply voltage REF_H/REF_L to directly generate the CML swing reference voltage CML_REF_SIG. Therefore, the level of the CML swing reference voltage CML_REF_SIG may easily change depending on a change in the CMOS region power supply voltage REF_H/REF_L due to a change in PVT (Process, Voltage, and Temperature).

However, the configuration of FIG. 6 drives the CMOS region power supply voltage REF_H/REF_L to generate the CML region power supply voltage CML_REP_H/CML_REP_L and drives the CML region power supply voltage CML_REP_H/CML_REP_L to generate the CML swing reference voltage CML_REF_SIG. Therefore, the level of the CML swing reference voltage CML_REF_SIG may be maintained constantly in spite of a change in the CMOS region power supply voltage REF_H/REF_L due to a change in PVT (Process, Voltage, and Temperature).

That is, the configuration of FIG. 6 provides a more stable operation than the configuration of FIG. 5. On the other hand, the configuration of FIG. 6 occupies a wider area than the configuration of FIG. 5.

Regarding the configuration illustrated in the drawings, the CML swing reference voltage generating unit 400 further includes a common sourcing current providing unit 406 configured to control the amount of a sourcing current REF_IS1/REF_IS2 provided in common to a CML region power supply voltage output terminal CRH_OUTND/CRL_OUTND and a CML swing reference voltage output terminal CRS_OUTND in response to the frequency setting code FRQ_CODE<0:3>.

Here, the CML region power supply voltage output unit 402A includes a CML region power sinking current providing unit (not illustrated) and a power supply voltage input unit (not illustrated).

The CML region power sinking current providing unit controls the amount of a sinking current (not illustrated) of the CML region power supply voltage output terminal CRH_OUTND/CRL_OUTND in response to the replica CML bias control voltage REP_CML_BIAS_CON. The power supply voltage input unit couples the common sourcing current providing unit 406 with the CML region power sinking current providing unit in an input period of the CMOS region power supply voltage REF_H/REF_L.

Likewise, the CML swing reference voltage output unit 402B includes a CML swing reference sinking current providing unit (not illustrated) and a CML region power supply voltage input unit (not illustrated).

The CML swing reference sinking current providing unit controls the amount of a sinking current (not illustrated) of the CML swing reference voltage output terminal CRS_OUTND in response to the replica CML bias control voltage REP_CML_BIAS_CON. The CML region power supply voltage input unit couples the common sourcing current providing unit 406 with the CML swing reference sinking current providing unit in an input period of the CML region power supply voltage CML_REP_H/CML_REP_L.

Although a detailed configuration of the CML region power supply voltage output unit 402A and a detailed configuration of the CML swing reference voltage output unit 402B are not illustrated in FIG. 6, it may be easily understood with reference to the configuration of the CML swing reference voltage output unit 402 of FIG. 5. That is, the CML region power supply voltage output unit 402A and the CML swing reference voltage output unit 402B of FIG. 6 may include the CML swing reference sinking current providing unit 4024 and the power supply voltage input unit 4026, except the CML swing reference sourcing current providing unit 4022 among the components of the CML swing reference voltage output unit 402 of FIG. 5.

In accordance with another embodiment of the present invention, the CML region power supply voltage output unit may include the CML region power sinking current providing unit, the power supply voltage input unit, and a CML region power sourcing current providing unit replacing the common sourcing current providing unit 406, which in not illustrated in drawings.

The CML region power sourcing current providing unit controls the amount of a sourcing current of a CML region power supply voltage output terminal in response to the frequency setting code FRQ_CODE<0:3>. The CML region power sinking current providing unit controls the amount of a sinking current of the CML region power supply voltage output terminal in response to the replica CML bias control voltage REP_CML_BIAS_CON. The power supply voltage input unit couples the CML region power sourcing current providing unit with the CML region power sinking current providing unit in an input period of the CMOS region power supply voltage REF_H/REF_L.

Likewise, the CML swing reference voltage output unit 402B may include a CML swing reference sourcing current providing unit, the CML swing reference sinking current providing unit, and the CML region power supply voltage input unit, which is not illustrated in drawings.

The CML swing reference sourcing current providing unit controls the amount of a sourcing current of the CML swing reference voltage output terminal in response to the frequency setting code FRQ_CODE<0:3>. The CML swing reference sinking current providing unit controls the amount of a sinking current (of the CML swing reference voltage output terminal in response to the replica CML bias control voltage REP_CML_BIAS_CON. The CML region power supply voltage input unit couples the CML swing reference sourcing current providing unit with the CML swing reference sinking current providing unit in an input period of the CML region power supply voltage CML_REP_H/CML_REP_L.

Although a detailed configuration of the CML region power supply voltage output unit and a detailed configuration of the CML swing reference voltage output unit are not illustrated in drawings, it may be easily understood with reference to the configuration of the CML swing reference voltage output unit 402 of FIG. 5. That is, the CML region power supply voltage output unit and the CML swing reference voltage output unit may have the same configuration as the CML swing reference voltage output unit 402 of FIG. 5.

The value of the frequency setting code FRQ_CODE<0:3> applied in common to the configuration of FIG. 5 and the configuration of FIG. 6 may be defined by various cases.

Although not illustrated in the drawings, the value of the frequency setting code FRQ_CODE<0:3> may be defined by a component for detecting an operation frequency of the integrated circuit.

Also, although not illustrated in the drawings, the value of the frequency setting code FRQ_CODE<0:3> may be defined by a mode register cell (MRS) whose value may be preset by a designer.

Also, although not illustrated in the drawings, the value of the frequency setting code FRQ_CODE<0:3> may be directly received from an external device through a predetermined pad.

The value of the CML target reference voltage CML_VREF applied in common to the configuration of FIG. 5 and the configuration of FIG. 6 may be defined by various cases.

As illustrated in FIG. 6, the integrated circuit may further include a CML target reference voltage generating unit 490 configured to divide a voltage level of an internal reference voltage, including a band gap reference voltage that is not affected by a change in PVT (Process, Voltage and Temperature), in a ratio changing depending on a target reference voltage selection code IRDROP<0:2> to generate a CML target reference voltage CML_VREF. Here, the value of the target reference voltage selection code IRDROP<0:2> may be preset in a mode register set (MRS) or may be received from an external device through a predetermined pad.

Although not illustrated in the drawings, the CML target reference voltage CML_VREF may be received from an external device through a predetermined pad.

An overall operation of the circuit for generating or transferring the CML signal in the integrated circuit in accordance with an exemplary embodiment of the present invention is summarized as follows.

When the frequency setting code FRQ_CODE<0:3> is determined as a value, the CML bias control voltage CML_BIAS_CON maintains one level. Thus, the CML swing reference voltage CML_REF_SIG generated by the CML swing reference voltage generating unit 400 maintains one level, and the CML output signal CML_SIG/CML_SIGb outputted from the CML buffering unit 440 swings in the CML region with one level as the center.

Here, if the value of the frequency setting code FRQ_CODE<0:3> changes, the level of the CML swing reference voltage CML_REF_SIG outputted from the CML swing reference voltage generating unit 400 changes.

When the level of the CML swing reference voltage CML_REF_SIG changes, the level of the CML swing reference voltage CML_REF_SIG becomes different from the level of the CML target reference voltage CML_VREF. Accordingly, the CML bias control voltage generating unit 420 operates, thereby changing the level of the CML bias voltage CML_BIAS.

When the level of the CML bias voltage CML_BIAS changes, the level of the CML swing reference voltage CML_REF_SIG changes again. This level change of the CML swing reference voltage CML_REF_SIG continues until it become equal to the level of the CML target reference voltage CML_VREF.

Meanwhile, when the value of the frequency setting code FRQ_CODE<0:3> changes and the level of the CML swing reference voltage CML_REF_SIG changes, the CML buffering unit 440 may also change the CML swing region of the CML output signal CML_SIG/CML_SIGb depending on a change in the value of the frequency setting code FRQ_CODE<0:3>.

Thus, the CML buffering unit 440 and the CML swing reference voltage generating unit 400 are controlled such that their operation periods do not overlap each other. For example, during a predetermined time period after a change of the value of the frequency setting code FRQ_CODE<0:3>, only the CML swing reference voltage generating unit 440 operates and the CML buffering unit 440 does not operate. Also, by designing the operation speed of the CML swing reference voltage generating unit 400 to be higher than the operation speed of the CML buffering unit 440, the level of the CML bias voltage CML_BIAS may be changed before the CML swing region of the CML output signal CML_SIG/CML_SIGb is affected after a change of the value of the frequency setting code FRQ_CODE<0:3>.

In this manner, the CML buffering unit 440 and the CML swing reference voltage generating unit 400 are controlled such that their operation periods do not overlap each other. Accordingly, even when the value of the frequency setting code FRQ_CODE<0:3> changes, the level of the CML bias voltage CML_BIAS changes and the change in the CML swing region of the CML output signal CML_SIG/CML_SIGb outputted from the CML buffering unit 440 is compensated. Consequently, the CML output signal CML_SIG/CML_SIGb outputted from the CML buffering unit 440 continues to maintain a constant swing region.

That is, even after a change in the frequency setting code FRQ_CODE<0:3>, the CML swing region of the CML output signal CML_SIG/CML_SIGb outputted from the CML buffering unit 440 may maintain the value that was determined before the change in the frequency setting code FRQ_CODE<0:3>.

As described above, in accordance with the exemplary embodiments of the present invention, the CML signal may maintain a stable target swing level in spite of a change in the operation frequency, by changing the level of the CML bias control voltage CML_BIAS_CON through the internal feedback operation depending on a change in the value of the frequency setting code FRQ_CODE<0:3>, i.e., the change in the operation frequency. Also, even when the PVT (Process, Voltage and Temperature) changes, the CML signal may maintain a stable target swing level, because the level of the CML vias control voltage CML_BIAS_CON can be changed through the internal feedback operation.

Accordingly, a component for changing the level of the CML bias control voltage CML_BIAS_CON in response to the frequency setting code FRQ_CODE<0:3> may not be included in the circuit for generating or transferring the CML signal, thus minimizing the occupation area.

As described above, the present invention can prevent a change in the target swing level of the CML signal by changing the level of the CML bias control voltage through the internal feedback operation depending on a change in the value of the frequency setting code, i.e., a change in the operation frequency, of the circuit for generating or transferring the CML signal in the integrated circuit.

The positions and types of the logic gates and transistors used herein may be differently implemented depending on polarities of the input signals.

While the present invention has been described with respect to the specific embodiments, it will be apparent to those skilled in the art that various changes and modifications may be made without departing from the spirit and scope of the invention as defined in the following claims.

What is claimed is:

1. An integrated circuit comprising:
   a current mode logic (CML) swing reference voltage generating unit configured to determine a level of a CML swing reference voltage in response to a frequency setting code and a CML bias control voltage;
   a CML bias control voltage generating unit configured to compare the level of the CML swing reference voltage with a level of a CML target reference voltage and determine a level of the CML bias control voltage based on the comparison result; and
   a CML buffering unit configured to generate a CML output signal swinging in a CML region by buffering an input signal and determine a swing level of the CML output signal on the basis of the level of the CML swing reference voltage in response to the frequency setting code and the CML bias control voltage.

2. The integrated circuit of claim 1, wherein the CML swing reference voltage generating unit comprises:
   a CML swing reference sourcing current providing unit configured to control the amount of a sourcing current flowing into an output node of the CML swing reference voltage in response to the frequency setting code;
   a CML swing reference sinking current providing unit configured to control the amount of a sinking current flowing from the output node of the CML swing reference voltage in response to the CML bias control voltage; and
   an operation control signal input unit configured to couple the CML swing reference sourcing current providing unit with the CML swing reference sinking current providing unit in an input period of an operation control signal.

3. The integrated circuit of claim 2, wherein the operation control signal has a voltage level corresponding to a CMOS region power supply voltage.

4. The integrated circuit of claim 2, wherein the operation control signal has a voltage level corresponding to a CML region power supply voltage.

5. The integrated circuit of claim 1, wherein the CML swing reference voltage generating unit comprises:
   a CML bias replica unit coupled in a current mirror configuration to an input node of the CML bias control voltage to generate a replica CML bias control voltage; and
   a CML swing reference voltage output unit configured to drive a CMOS region power supply voltage, output the CML swing reference voltage, and change the level of the CML swing reference voltage in response to the frequency setting code and the replica CML bias control voltage.

6. The integrated circuit of claim 5, wherein the CML swing reference voltage output unit comprises:
   a CML swing reference sourcing current providing unit configured to control the amount of a sourcing current flowing into an output node of the CML swing reference voltage in response to the frequency setting code;
   a CML swing reference sinking current providing unit configured to control the amount of a sinking current flowing from the output node of the CML swing reference voltage in response to the replica CML bias control voltage; and
   a power supply voltage input unit configured to couple the CML swing reference sourcing current providing unit with the CML swing reference sinking current providing unit in an input period of the CMOS region power supply voltage.

7. The integrated circuit of claim 6, wherein the power supply voltage input unit comprises a first input NMOS transistor configured to control the coupling of the drain-coupled CML swing reference sourcing current providing unit with the source-coupled CML swing reference sinking current providing unit in response to a first power supply voltage of the CMOS region power supply voltage applied to a gate thereof.

8. The integrated circuit of claim 7, wherein the power supply voltage input unit further comprises a second input NMOS transistor configured to control the coupling of the drain-coupled CML swing reference sourcing current providing unit with the source-coupled CML swing reference sinking current providing unit in response to a second power supply voltage of the CMOS region power supply voltage applied to a gate thereof.

9. The integrated circuit of claim 5, wherein the CML swing reference voltage generating unit further comprises a CML region power supply voltage output unit configured to drive the CMOS region power supply voltage, provide a CML region power supply voltage to the CML swing reference voltage output unit as the CMOS region power supply voltage, and change the level of the CML region power supply voltage in response to the frequency setting code and the replica CML bias control voltage.

10. The integrated circuit of claim 9, wherein the CML region power supply voltage output unit comprises:
   a CML region power sourcing current providing unit configured to control the amount of a source current flowing into an output node of the CML region power supply voltage in response to the frequency setting code;
   a CML region power sinking current providing unit configured to control the amount of a sinking current flowing from the output node of the CML region power supply voltage in response to the replica CML bias control voltage; and
   a power supply voltage input unit configured to couple the CML region power sourcing current providing unit with the CML region power sinking current providing unit in an input period of the CMOS region power supply voltage.

11. The integrated circuit of claim 9, wherein the CML swing reference voltage generating unit further comprises a common sourcing current providing unit configured to control the amount of a sourcing current provided in common to an output node of the CML region power supply voltage and an output node of the CML swing reference voltage in response to the frequency setting code.

12. The integrated circuit of claim 11, wherein the CML region power supply voltage output unit comprises:
   a CML region power sinking current providing unit configured to control the amount of a sinking current flowing from the output node of the CML region power supply voltage in response to the replica CML bias control voltage; and
   a power supply voltage input unit configured to couple the common sourcing current providing unit with the CML region power sinking current providing unit in an input period of the CMOS region power supply voltage.

13. The integrated circuit of claim 12, wherein the CML swing reference voltage output unit comprises:
   a CML swing reference sinking current providing unit configured to control the amount of a sinking current flowing from the output node of the CML swing reference voltage in response to the replica CML bias control voltage; and
   a CML region power supply voltage input unit configured to couple the common sourcing current providing unit with the CML swing reference sinking current providing unit in an input period of the CML region power supply voltage.

14. The integrated circuit of claim 1, wherein the CML buffering unit comprises a plurality of CML buffers configured to buffer a plurality of input signals, output a plurality of CML signals, and determine a swing level of the CML signals on the basis of the level of the CML swing reference voltage in response to the frequency setting code and the CML bias control voltage.

15. The integrated circuit of claim 14, wherein each of the CML buffers comprises:
- a CML output sourcing current providing unit configured to control the amount of a source current flowing into an output node of the CML signal in response to the frequency setting code;
- a CML output sinking current providing unit configured to control the amount of a sinking current flowing from the output node of the CML signal in response to the CML bias control voltage; and
- a signal input unit configured to control the coupling of the CML output sourcing current providing unit with the CML output sinking current providing unit in response to the input signal applied through a signal input terminal and configured to change a potential level of the CML signal outputted through the output node.

16. The integrated circuit of claim 1, further comprising a CML target reference voltage generating unit configured to divide a voltage level of an internal reference voltage, including a band gap reference voltage, in a ratio changing depending on a target reference voltage selection code to generate the CML target reference voltage.

17. The integrated circuit of claim 16, wherein the value of the target reference voltage selection code is set in a mode register set (MRS), or is received from an external device through a predetermined pad.

18. The integrated circuit of claim 1, wherein the value of the frequency setting code is determined depending on the frequency of the input signal, or is set in a mode register set (MRS), or is received from an external device through a predetermined pad.

19. A method for operating an integrated circuit, comprising:
- changing a frequency setting code;
- changing a level of a current mode logic (CML) swing reference voltage in response to a changed frequency setting code;
- comparing a changed level of the CML swing reference voltage with a level of a CML target reference voltage and changing a level of a CML bias control voltage based on the comparison result;
- compensating the changed level of the CML swing reference voltage in response to the changed level of the CML bias control voltage; and
- buffering an input signal to generate a CML output signal swinging in a CML region.

20. The method of claim 19, wherein a swing level of the CML output signal is determined on the basis of the level of the CML swing reference voltage in response to the changed frequency setting code and the changed level of the CML bias control voltage.

21. The method of claim 19, wherein the changing of the level of the CML swing reference voltage and the compensating of the changed level of the CML swing reference voltage comprises:
- driving a CMOS region power supply voltage to generate the CML swing reference voltage; and
- determining the level of the CML swing reference voltage in response to the frequency setting code or the CML bias control voltage.

22. The method of claim 21, wherein the driving of the CMOS region power supply voltage comprises:
- dividing the CMOS region power supply voltage to generate a CML region power supply voltage; and
- changing a level of the CML region power supply voltage in response to the frequency setting code and the CML bias control voltage.

23. The method of claim 19, wherein the changing of the frequency setting code comprises:
- changing a value of the frequency setting code in response to a signal received from an external device through a predetermined pad;
- changing a value of the frequency setting code in response to a signal whose value is predefined by a mode register set (MRS); or
- changing a value of the frequency setting code depending on a detected operation frequency of the input signal.

* * * * *